(12) United States Patent
Zang et al.

(10) Patent No.: US 10,038,096 B2
(45) Date of Patent: Jul. 31, 2018

(54) THREE-DIMENSIONAL FINFET TRANSISTOR WITH PORTION(S) OF THE FIN CHANNEL REMOVED IN GATE-LAST FLOW

(71) Applicant: GLOBALFOUNDRIES Inc., Grand Caymay (KY)

(72) Inventors: Hui Zang, Guilderland, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/847,462

(22) Filed: Sep. 8, 2015

(65) Prior Publication Data
US 2017/0069759 A1   Mar. 9, 2017

(51) Int. Cl.
| H01L 21/336 | (2006.01) |
| H01L 21/76 | (2006.01) |
| H01L 21/311 | (2006.01) |
| H01L 29/78 | (2006.01) |
| H01L 21/762 | (2006.01) |
| H01L 29/06 | (2006.01) |
| H01L 29/66 | (2006.01) |

(52) U.S. Cl.
CPC .... *H01L 29/7853* (2013.01); *H01L 21/76224* (2013.01); *H01L 29/0653* (2013.01); *H01L 29/66545* (2013.01); *H01L 29/66575* (2013.01); *H01L 29/66795* (2013.01)

(58) Field of Classification Search
CPC .......... H01L 29/7853; H01L 29/66545; H01L 29/66575; H01L 29/0653; H01L 21/76224; H01L 29/66795
See application file for complete search history.

(56) References Cited

U.S. PATENT DOCUMENTS

| 8,338,305 | B2* | 12/2012 | Chen | H01L 21/3086 257/E21.689 |
| 9,105,746 | B2* | 8/2015 | Kim | H01L 29/66545 |
| 2006/0175669 | A1* | 8/2006 | Kim | H01L 29/4908 257/401 |
| 2007/0158756 | A1* | 7/2007 | Dreeskornfeld | H01L 21/823412 257/374 |
| 2008/0057634 | A1* | 3/2008 | Lee | H01L 29/66795 438/156 |
| 2008/0124931 | A1* | 5/2008 | Lee | H01L 21/0332 438/692 |
| 2008/0303085 | A1* | 12/2008 | Jung | H01L 21/823412 257/330 |
| 2010/0190305 | A1* | 7/2010 | Lee | H01L 29/66795 438/239 |
| 2013/0062669 | A1* | 3/2013 | Chen | H01L 29/401 257/288 |
| 2014/0191300 | A1* | 7/2014 | Jhaveri | H01L 29/66795 257/288 |
| 2014/0315371 | A1* | 10/2014 | Cai | H01L 21/823821 438/424 |

* cited by examiner

Primary Examiner — Su C Kim
(74) Attorney, Agent, or Firm — Heslin Rothenberg Farley & Mesiti P.C.; Stephen P. Scuderi

(57) ABSTRACT

A three-dimensional transistor includes a channel with a center portion (forked channel) or side portions (narrow channel) removed, or fins without shaping, after removal of the dummy gate and before a replacement metal gate is formed.

7 Claims, 13 Drawing Sheets

US 10,038,096 B2

THREE-DIMENSIONAL FINFET TRANSISTOR WITH PORTION(S) OF THE FIN CHANNEL REMOVED IN GATE-LAST FLOW

BACKGROUND OF THE INVENTION

Technical Field

The present invention generally relates to three-dimensional fin-type transistor fabrication. More particularly, the present invention relates to fabrication including removal of part of the channel for tuning FinFET performance in replacement-metal-gate (RMG) or gate-last flow.

Background Information

As semiconductor devices continues to scale down, fabrication challenges continue to mount for providing both the smaller foot print and improved performance Therefore, the 3-dimensional fin-type FET (referred to as FinFET) technology becomes widespread since 14 nm node and beyond replacing the older planar CMOS technology at 20 nm node and older.

Thus, a need continues to exist for downward scalable semiconductor fabrication techniques that improve performance.

SUMMARY OF THE INVENTION

The shortcomings of the prior art are overcome and additional advantages are provided through the provision, in one aspect, of a method of fin formation. The method comprises providing a starting three-dimensional semiconductor structure, the structure comprising a semiconductor substrate and at least one fin coupled thereto, each of the at least one fin comprising an active region situated across a top portion thereof, each active region comprising a channel region in a top center thereof between a source region and a drain region, and removing a center portion of only the channel region of one or more active regions, the removing resulting in, for each of the one or more active regions, a remaining portion of each channel region having a forked cross-sectional shape.

In accordance with another aspect, a method is provided. The method comprises providing a starting semiconductor structure, the structure comprising a semiconductor substrate, forming at least one U-shaped member of hard mask material over the substrate, each U-shaped member being filled with at least one filler material, removing portions of the substrate not covered by the at least one U-shaped member, the removing forming one or more fins, and forming a layer of isolation material about a bottom portion of the fins. The method further includes removing the at least one filler material, leaving a U-shaped member of hard mask material atop each fin, extending an opening in each U-shaped member into a body of the at least one fin at only a channel region, and removing any remaining hard mask material, resulting in the channel region having a forked cross-sectional shape.

In accordance with yet another aspect, a semiconductor structure is provided, comprising a semiconductor substrate, at least one semiconductor fin coupled to the substrate, the at least one fin comprising a source region, a drain region and a channel region therebetween, and isolation material surrounding a bottom portion of the at least one fin, a center portion of only the channel region having been removed, resulting in a remaining channel region having two opposite side portions and a bottom portion connecting the two opposite side portions, and a cross-section of the remaining channel region having a forked shape.

These, and other objects, features and advantages of this invention will become apparent from the following detailed description of the various aspects of the invention taken in conjunction with the accompanying drawings.

DETAILED DESCRIPTION OF THE INVENTION

Figure 1:
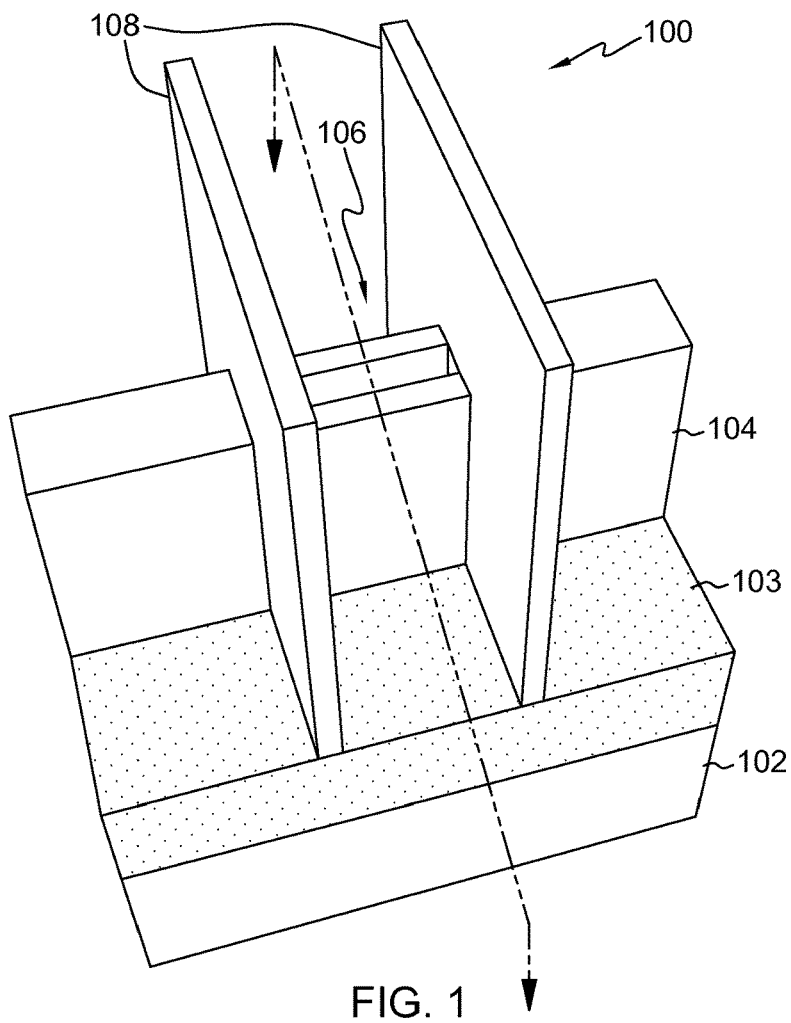
FIG. 1 is a three-dimensional perspective view of a simplified example of a semiconductor structure, in accordance with one or more aspects of the present invention, the structure including a semiconductor substrate and a fin coupled to the substrate and surrounded at a bottom portion thereof by isolation material, the fin being forked in a channel region thereof, the channel being enclosed by spacers along the sides of a gate (not shown for simplicity).

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable.

For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a three-dimensional perspective view of a simplified example of a semiconductor structure 100, in accordance with one or more aspects of the present invention, the structure including a semiconductor substrate 102 and a fin 104 coupled to the substrate and surrounded at a bottom portion thereof by isolation material 103, the active fin being forked into two smaller fins in a channel region 106 thereof, the channel region enclosed by spacers 108 and it is embedded by the replacement gate layers with high-k, work-function and electrode layers (not shown here for simplicity).

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The non-planar structure further includes at least one raised semiconductor structure 104 (raised with respect to the substrate). In one example, the raised structures may take the form of a "fin." The raised structure(s) may be etched from a bulk substrate, and may include, for example, any of the materials listed above with respect to the substrate. Further, some or all of the raised structure(s) may include added impurities (e.g., by doping), making them n-type or p-type. The structure further includes at least one gate structure surrounding channel region 106 (omitted for clarity) with spacers 108 surrounding a portion of one or more of the raised structures 104.

Figure 2:
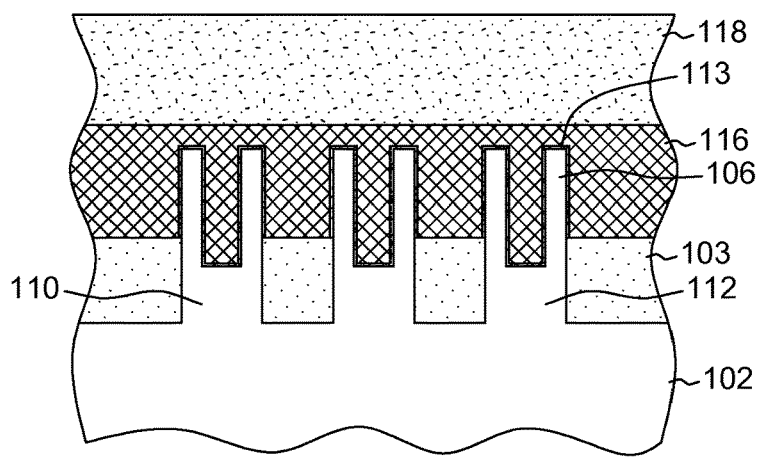
FIG. 2 is a cross-sectional view taken across the channel region of one example of the structure of FIG. 1 with two additional fins also forked in the channel region, and after the formation of a conformal dielectric layer (e.g., high-k dielectric) around exposed surfaces of the fins, the formation of a gate stack (e.g., work function material(s)) over the fins and a conductive material over the gate stack, in accordance with one or more aspects of the present invention.

FIG. 2 is a cross-sectional view taken across the channel region 106 of one example of the structure of FIG. 1 with two additional fins 110, 112 also forked in the channel region, and after the formation of a conformal dielectric layer 113 (e.g., high-k dielectric) around exposed surfaces of the fins, the formation of a gate structure 116 (not shown in FIG. 1 for simplicity) (e.g., work function material(s)) over the fins and a conductive material 118 over the gate structure, in accordance with one or more aspects of the present invention.

Figure 3:
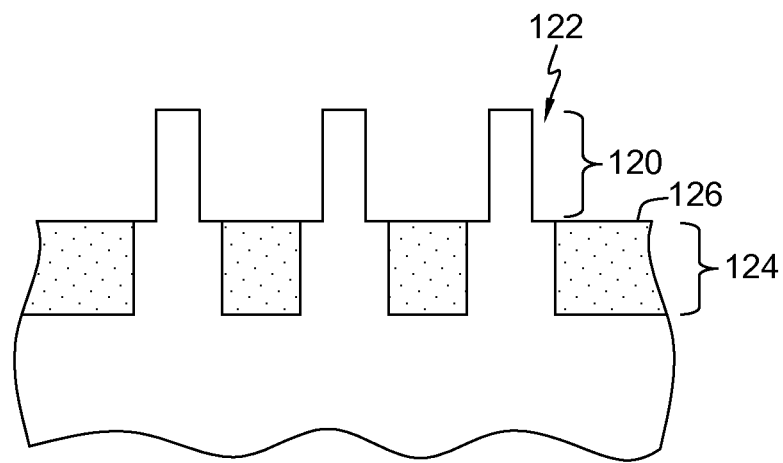
FIG. 3 is a cross-sectional view of another example fin structure, in accordance with one or more aspects of the present invention, the fin structure including a narrowed top portion (i.e., active fin), and a bottom portion of the fin(s) being surrounded by isolation material.

FIG. 3 is a cross-sectional view of another example fin structure, in accordance with one or more aspects of the present invention, the fin structure including a narrowed top portion (e.g., top portion 120 of fin 122), and a bottom portion of the fin(s) (e.g., bottom portion 124 of fin 122) being surrounded by isolation material 126.

Figure 4:
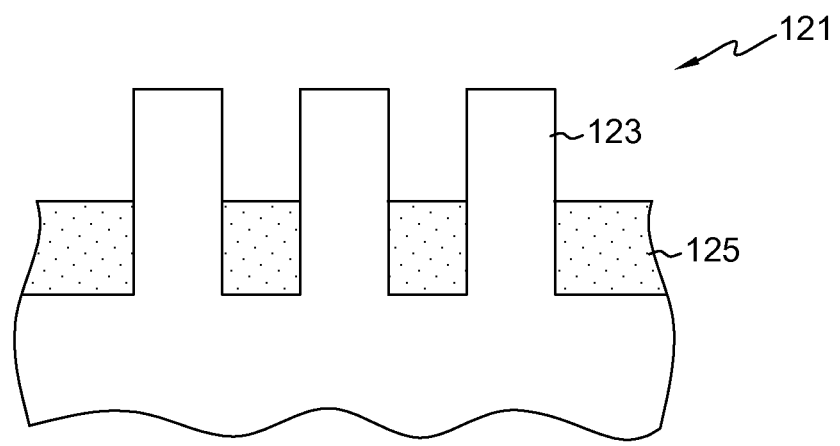
FIG. 4 is a cross-sectional view of another example fin structure, where no shaping of the fins takes place, leaving a comparatively wider fin, in accordance with one or more aspects of the present invention.

FIG. 4 is a cross-sectional view of another example fin structure 121 where no shaping of the fins takes place, leaving a comparatively wider fin (e.g., fin 123), the fins surrounded at the bottom by isolation material 125, in accordance with one or more aspects of the present invention.

Figure 5:
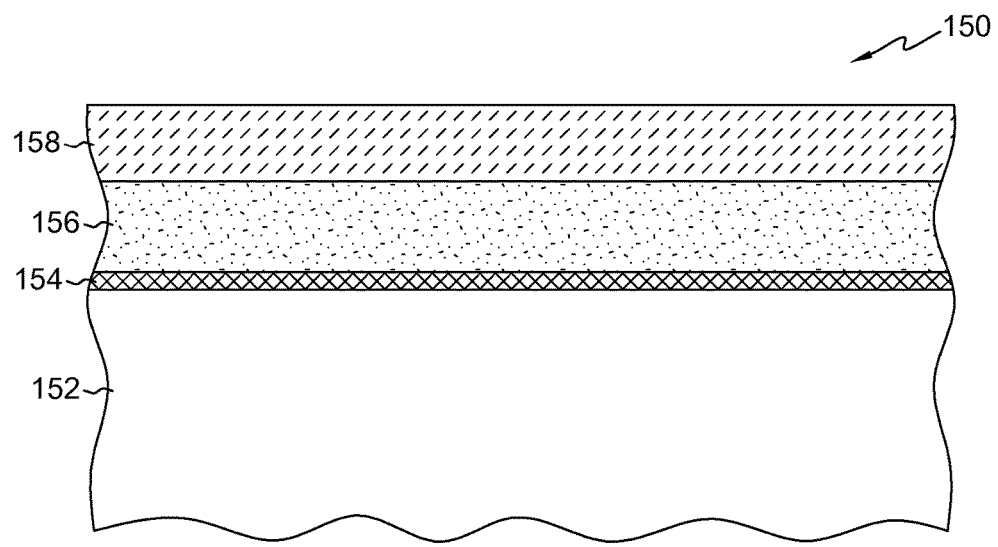
FIG. 5 is a cross-sectional view of one example of a starting semiconductor structure (for the formation of various fin structures in FIGS. 1-4), in accordance with one or more aspects of the present invention, the structure including a semiconductor substrate (e.g., silicon), a protective layer (e.g., a nitride) over the substrate, a layer of dummy gate material (e.g., polysilicon) over the protective layer and a layer of amorphous carbon over the layer of dummy gate material.

FIG. 5 is a cross-sectional view of one example of a starting semiconductor structure 150 for any of FIGS. 1-4, in accordance with one or more aspects of the present invention, the structure including a semiconductor substrate 152 (e.g., silicon), a protective layer 154 (e.g., a nitride) over the substrate, a layer of dummy gate material 156 (e.g., polysilicon) over the protective layer and a layer of amorphous carbon 158 for lithography/patterning over the layer of dummy gate material.

Figure 6:
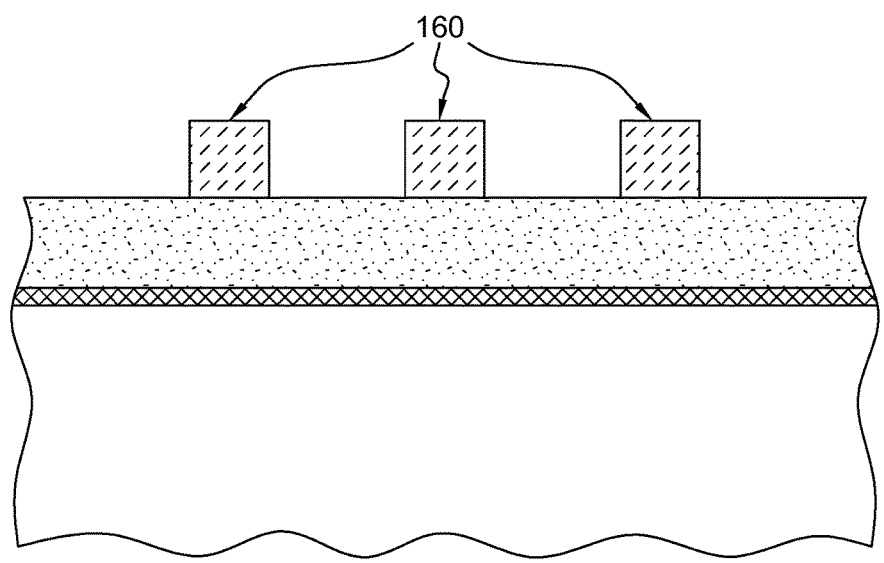
FIG. 6 depicts one example of the starting semiconductor structure of FIG. 5 after removing portions of the amorphous carbon layer to form mandrels, in accordance with one or more aspects of the present invention.

FIG. 6 depicts one example of the starting semiconductor structure of FIG. 5 after patterning the amorphous carbon layer (158, FIG. 8) to form mandrels 160, in accordance with one or more aspects of the present invention.

Figure 7:
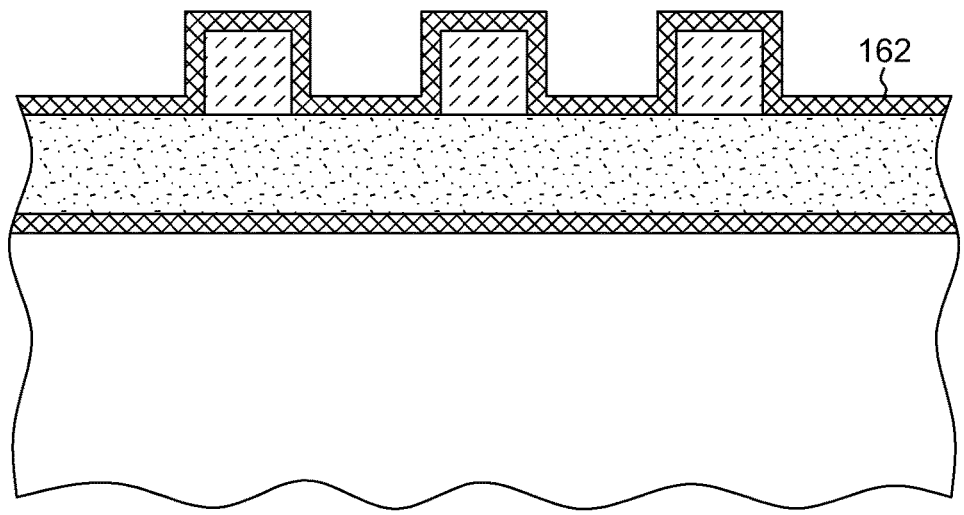
FIG. 7 depicts one example of the semiconductor structure of FIG. 6 after formation of a blanket conformal layer of a protective material, for example, a nitride (e.g., SiN) over the structure, in accordance with one or more aspects of the present invention.

FIG. 7 depicts one example of the semiconductor structure of FIG. 6 after formation of a blanket conformal layer of a protective material, for example, a nitride (e.g., SiN) 162 over the structure, in accordance with one or more aspects of the present invention.

Figure 8:
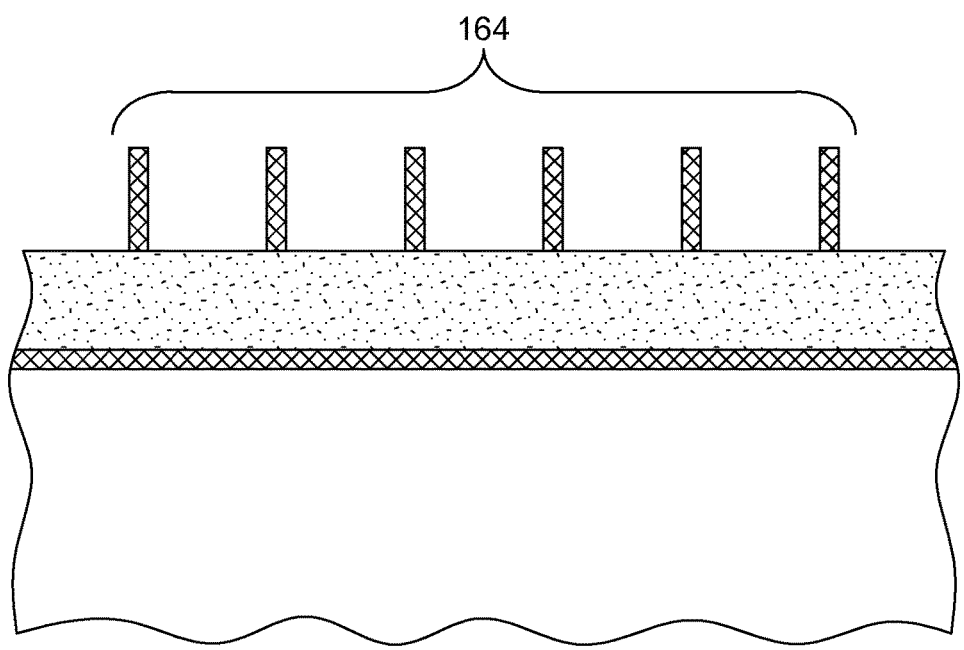
FIG. 8 depicts one example of the semiconductor structure of FIG. 7 after horizontal sections of the conformal protective layer are removed, leaving only vertical sections thereof, and removal of the mandrels, in accordance with one or more aspects of the present invention.

FIG. 8 depicts one example of the semiconductor structure of FIG. 7 after horizontal sections of the conformal protective layer 162 are removed (i.e., etch back of material 162 anisotropically), leaving only vertical sections 164 (or spacers) thereof, and removal of the mandrels (160, FIG. 6), in accordance with one or more aspects of the present invention.

Figure 9:
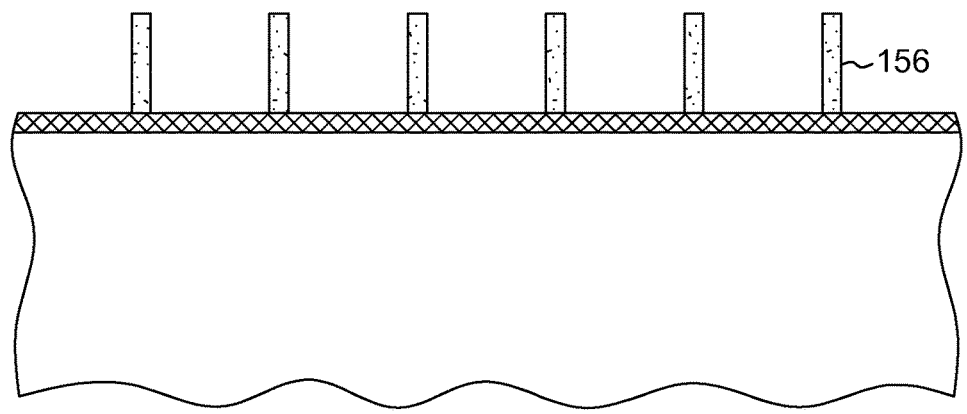
FIG. 9 depicts one example of the semiconductor structure of FIG. 8 after removing sections of the dummy gate layer not covered by the vertical sections and removal thereof, in accordance with one or more aspects of the present invention.

FIG. 9 depicts one example of the semiconductor structure of FIG. 8 after removing (e.g., by anisotropic etching) sections of the dummy gate layer 156 not covered by the vertical sections (164, FIG. 8) and removal of the vertical sections, in accordance with one or more aspects of the present invention.

Figure 10:
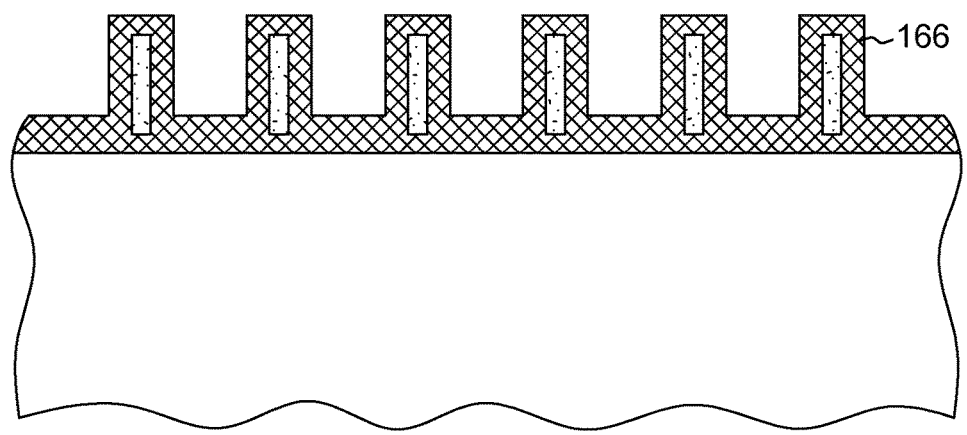
FIG. 10 depicts one example of the semiconductor structure of FIG. 9 after formation of a blanket conformal protective layer (e.g., SiN) over the structure, in accordance with one or more aspects of the present invention.

FIG. 10 depicts one example of the semiconductor structure of FIG. 9 after formation of a blanket conformal protective layer 166 (e.g., SiN) over the structure, in accordance with one or more aspects of the present invention. Note that blanket layer 166 need not be a same material as layer 154 (see FIG. 5).

Figure 11:
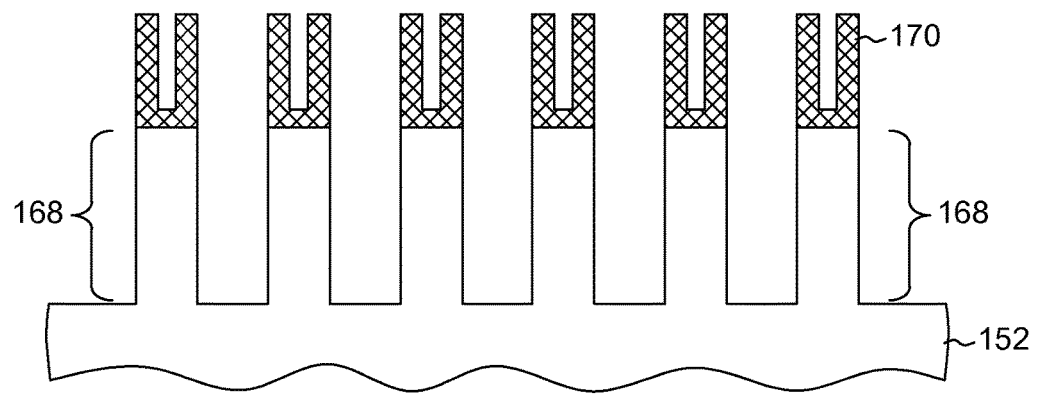
FIG. 11 depicts one example of the semiconductor structure of FIG. 10 after removal of the exposed horizontal portions of the protective layer and portions of the substrate thereunder, leaving fins and U-shaped protective layer portions containing a remainder of the dummy gate material, in accordance with one or more aspects of the present invention.

FIG. 11 depicts one example of the semiconductor structure of FIG. 10 after removal of the exposed horizontal portions of the protective layers (e.g., by anisotropic etching of layer 166) and portions of the substrate 152 thereunder, leaving fins 168 and U-shaped protective layer portions 170, in accordance with one or more aspects of the present invention.

Figure 12:
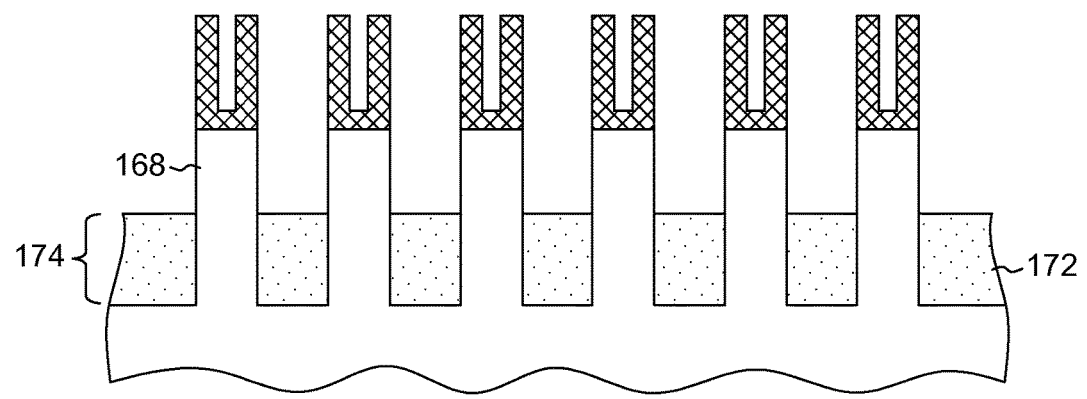
FIG. 12 depicts one example of the semiconductor structure of FIG. 11 after forming a layer of isolation material surrounding lower portions of fins, the isolation material also covering previously exposed portions of the substrate in FIG. 11, in accordance with one or more aspects of the present invention.

FIG. 12 depicts one example of the semiconductor structure of FIG. 11 after forming a layer of isolation material 172 surrounding lower portions 174 of fins 168, the isolation material also covering previously exposed portions of the substrate in FIG. 11, in accordance with one or more aspects of the present invention.

Figure 13:
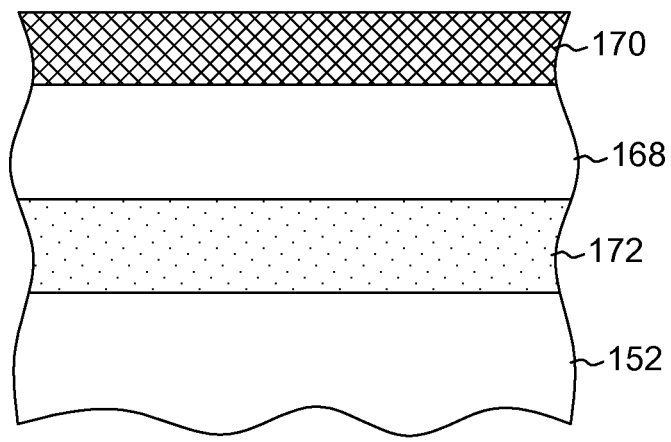
FIG. 13 depicts one example of the semiconductor structure of FIG. 12 looking from either end (i.e., rotating by 90°), in accordance with one or more aspects of the present invention.

FIG. 13 depicts one example of the semiconductor structure of FIG. 12 looking from either end of edge (i.e., rotating by 90°), in accordance with one or more aspects of the present invention.

Figure 14:
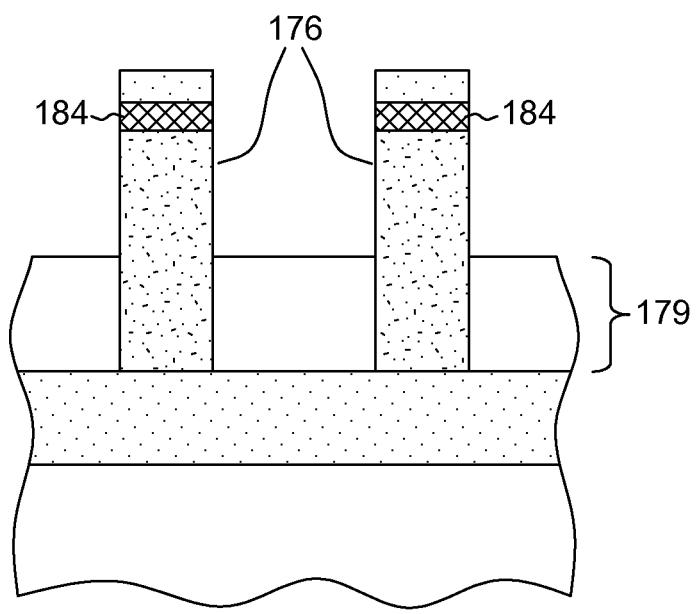
FIG. 14 depicts one example of the semiconductor structure of FIG. 13 after forming dummy gates and removing the U-shaped nitride layer portions, in accordance with one or more aspects of the present invention.

FIG. 14 depicts one example of the semiconductor structure of FIG. 13 after forming dummy gates 176 (with hard-mask and capping layer 184) and removing the U-shaped nitride layer portions (170, FIG. 13) outside the dummy gates 176, in accordance with one or more aspects of the present invention.

Figure 15:
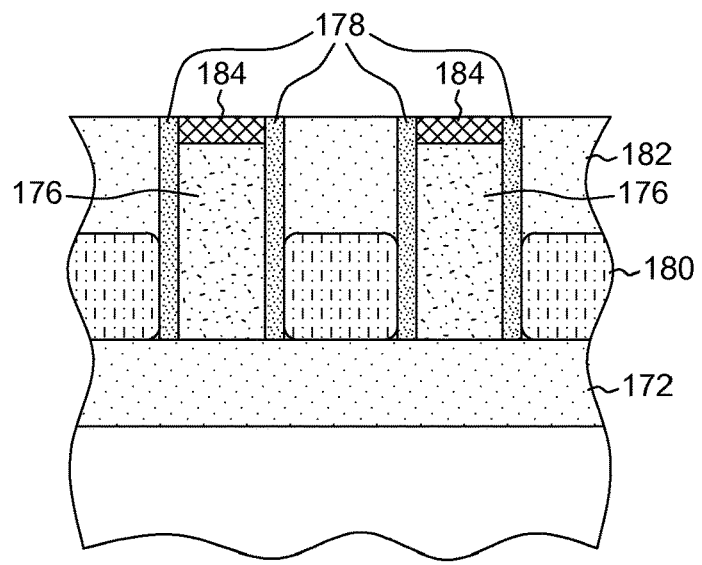
FIG. 15 depicts one example of the semiconductor structure of FIG. 14 after forming spacers aside the dummy gates, etching portions of the fins and forming epitaxial material where etched, forming a blanket layer of dielectric material and planarizing using dummy gate caps as a stop, in accordance with one or more aspects of the present invention.

FIG. 15 depicts one example of the semiconductor structure of FIG. 14 after forming spacers 178 aside the dummy gates 176, etching portions (179, FIG. 14) of the fins and forming epitaxial material 180 where etched, forming a blanket layer of dielectric material 182 and planarizing (e.g., using a chemical-mechanical polishing process (CMP)) and using dummy gate caps 184 as a stop for CMP, in accordance with one or more aspects of the present invention.

Figure 16:
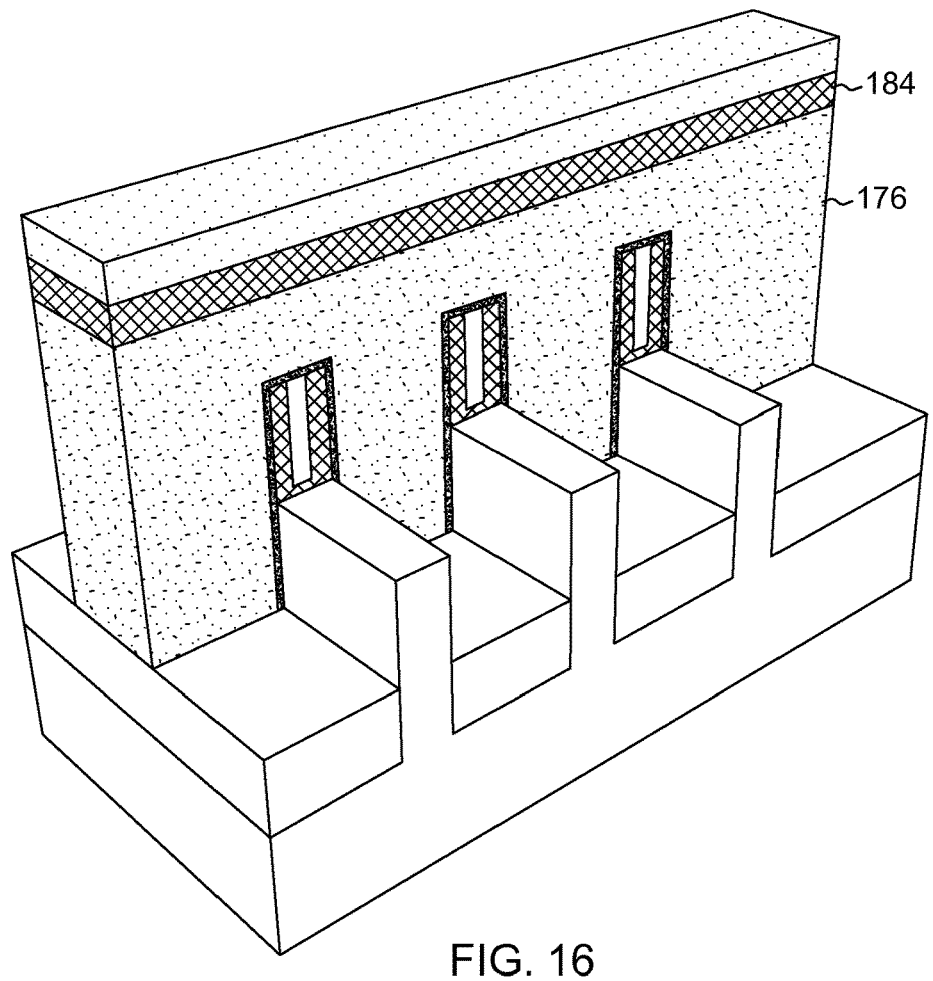
FIG. 16 is a three-dimensional perspective of a portion of the structure of FIG. 14, showing only one dummy gate for ease of understanding, in accordance with one or more aspects of the present invention.

FIG. 16 is a three-dimensional perspective of a portion of the structure of FIG. 14, showing only one dummy gate for ease of understanding, in accordance with one or more aspects of the present invention.

Figure 17:
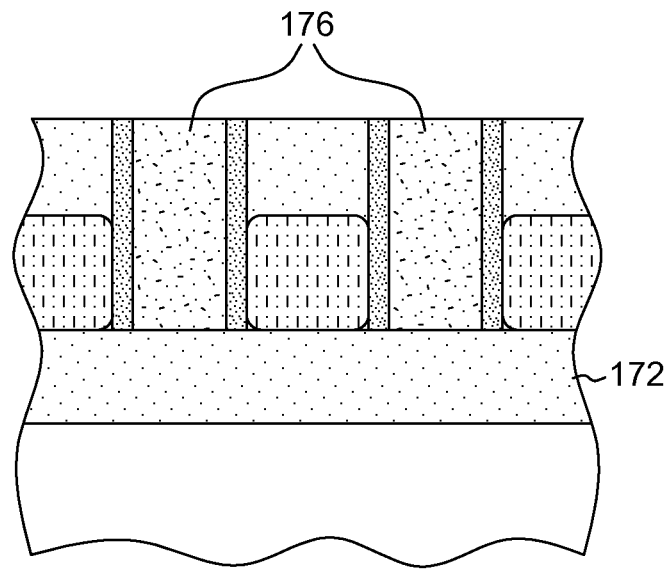
FIG. 17 depicts one example of the semiconductor structure of FIG. 16 after further planarization down to dummy gates, in accordance with one or more aspects of the present invention.

FIG. 17 depicts one example of the semiconductor structure of FIG. 15 after further planarization (e.g., by CMP) down to dummy gates 176 with capping layer 184 removed by, for example, CMP, in accordance with one or more aspects of the present invention.

Figure 18:
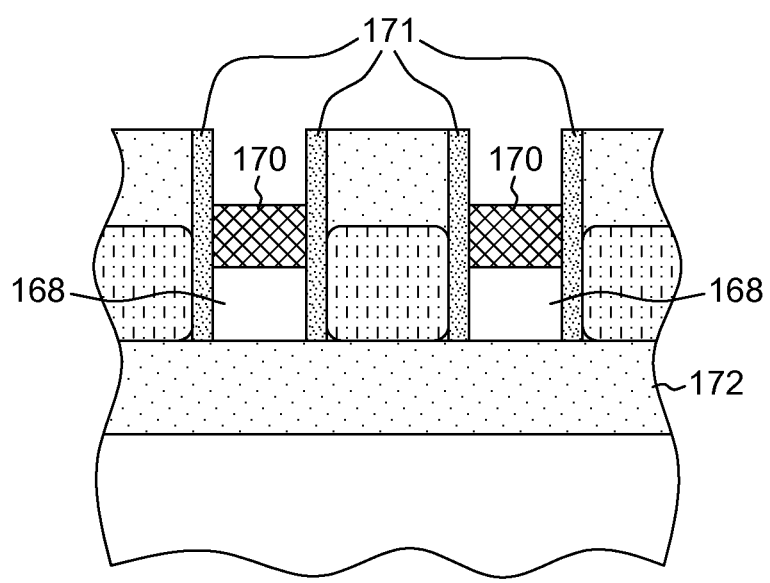
FIG. 18 depicts one example of the semiconductor structure of FIG. 17 after removing the gate cap and the dummy gate material, in accordance with one or more aspects of the present invention.

FIG. 18 depicts one example of the semiconductor structure of FIG. 17 after removing the dummy gate material (typically by wet etching for better selectivity), in accordance with one or more aspects of the present invention.

Figure 19:
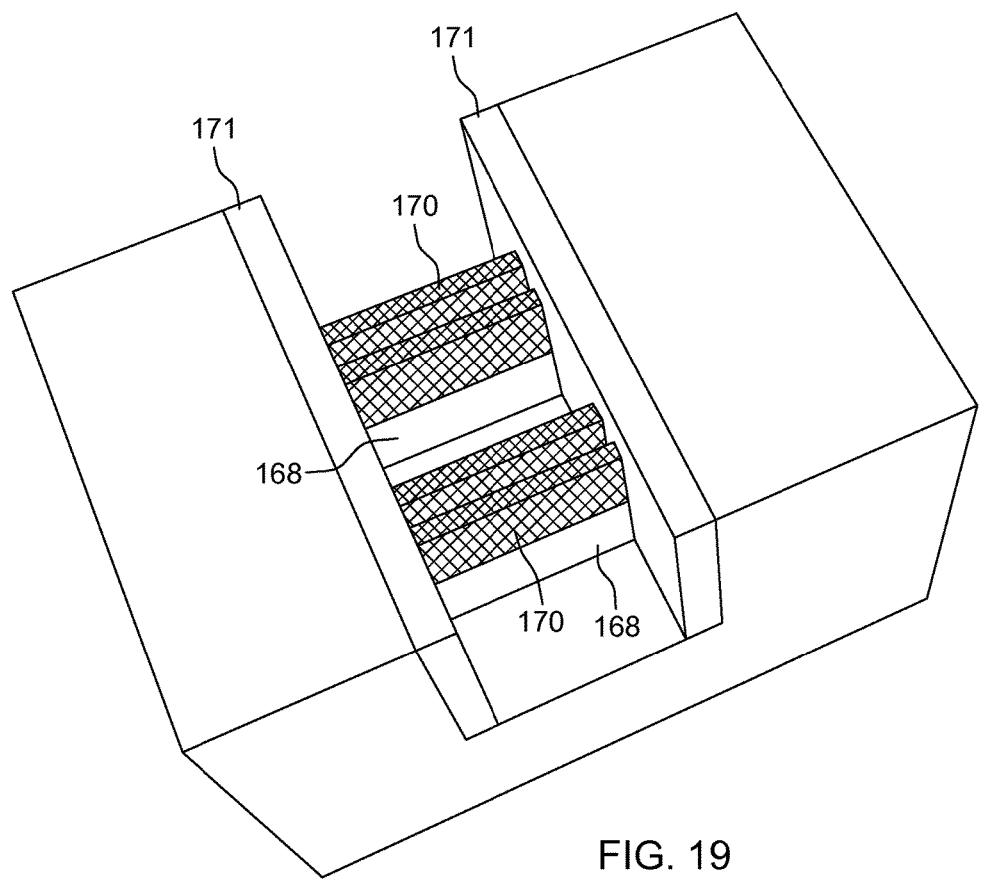
FIG. 19 is a three-dimensional view of one example of the structure of FIGS. 18 and 20 (FIG. 20 rotated 90° from FIG. 18) without the isolation material for clarity, the structure including U-shaped nitride layer portions, fins and spacers, in accordance with one or more aspects of the present invention.
Figure 20:
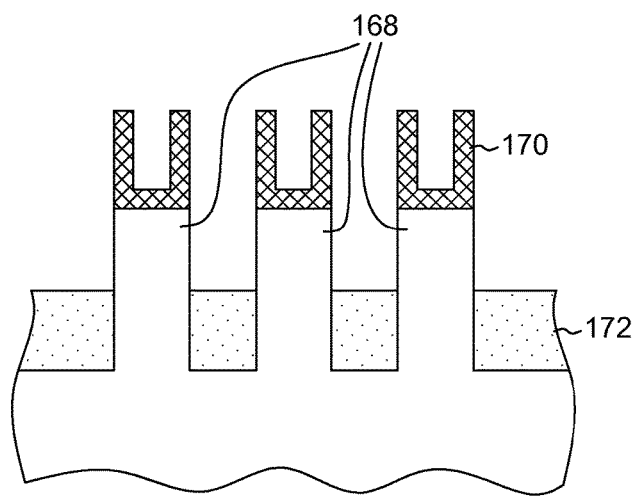
FIG. 20 depicts one example of the structure of FIG. 18 taken through the as-yet empty gate, in accordance with one or more aspects of the present invention.

FIG. 19 is a three-dimensional view of one example of the structure of FIGS. 18 and 20 (FIG. 20 rotated 90° from FIG. 18) without the isolation material (172, FIG. 12) for clarity, the structure including U-shaped nitride layer portions 170, fins 168 and spacers 171, in accordance with one or more aspects of the present invention.

FIG. 20 depicts one example of the structure of FIG. 18 taken through the as-yet empty gate, in accordance with one or more aspects of the present invention.

It should be noted here that any fin reshaping (e.g., as in FIGS. 22 and 23) is done before deposition of high-k, work-function layers, and conductive metal electrode.

Figure 21:
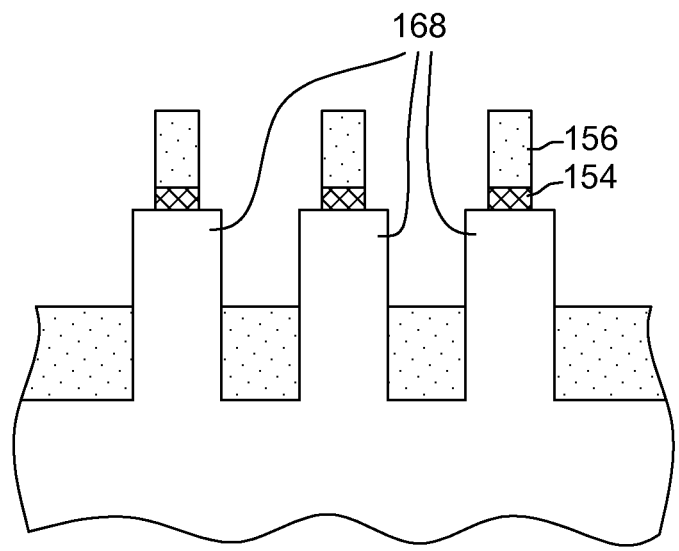
FIG. 21 depicts one example of the structure of FIG. 20 after having filled the gate openings with dummy gate material (necessarily also filling the U-shape member openings), and removing side portions of the U-shaped members, in accordance with one or more aspects of the present invention.

FIG. 21 depicts one example of the structure of FIG. 18 after having instead removed side portions of the U-shaped members (see FIG. 14), in accordance with one or more aspects of the present invention.

Figure 22:
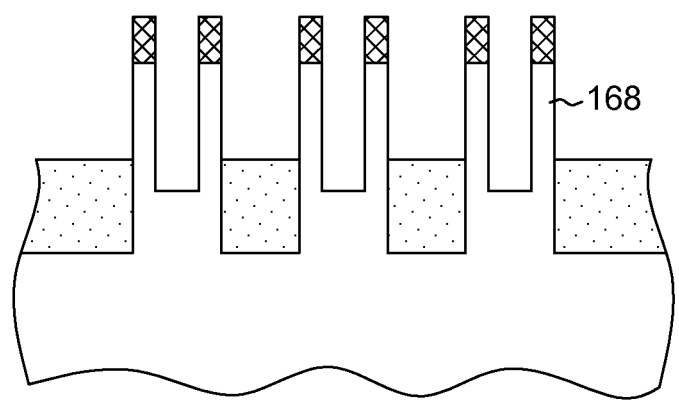
FIG. 22 depicts one example of the semiconductor structure of FIG. 20 after removal of a portion of the center of the fin and top portions of sidewalls of the U-shaped members, resulting in a U-shaped or fork-shaped fin, in accordance with one or more aspects of the present invention.

FIG. 22 depicts one example of the semiconductor structure of FIG. 20 after etching of a portion of the center of the fin 168 and some top portions of sidewalls of the U-shaped members 170, resulting in U-shaped or fork-shaped fins, in accordance with one or more aspects of the present invention.

Figure 23:
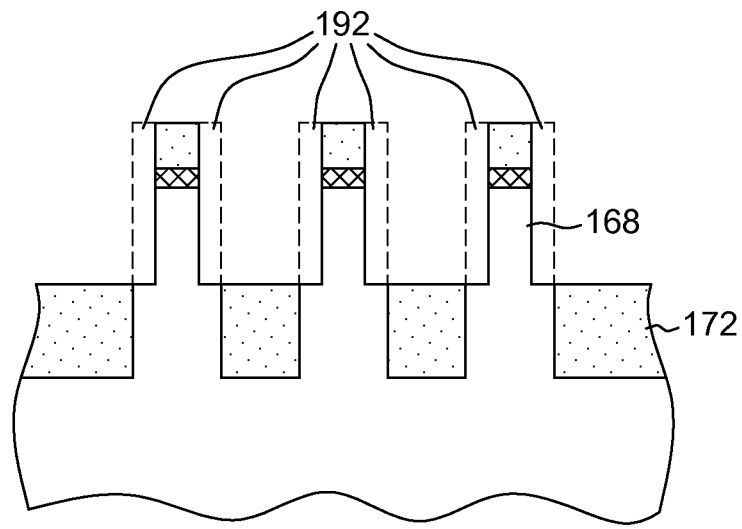
FIG. 23 depicts one example of the semiconductor structure of FIG. 21 after removing the side portions of the fins down to the layer of isolation material, in accordance with one or more aspects of the present invention.

FIG. 23 depicts one example of the semiconductor structure of FIG. 21 after removing the side portions 192 of the fins down to the layer of isolation material 172, in accordance with one or more aspects of the present invention.

Figure 24:
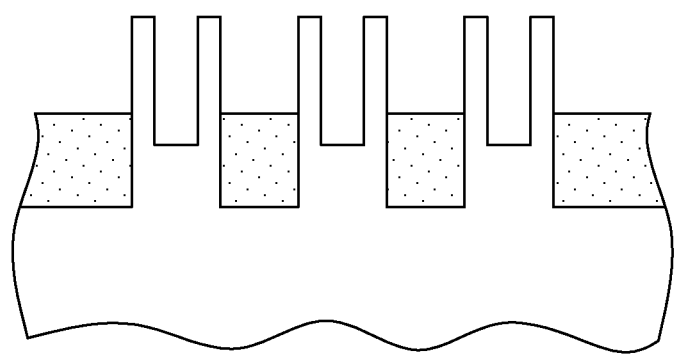
FIGS. 24 and 25 depict examples of the semiconductor structure of FIGS. 22 and 23, respectively, after removing remaining material atop the fins, in accordance with one or more aspects of the present invention.
Figure 25:
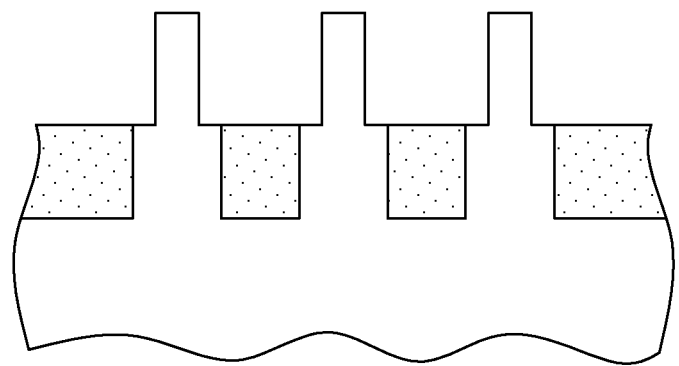

FIGS. 24 and 25 depict examples of the semiconductor structure of FIGS. 22 and 23, respectively, after removing remaining material (of the U-shape) atop the fins, in accordance with one or more aspects of the present invention.

Figure 26:
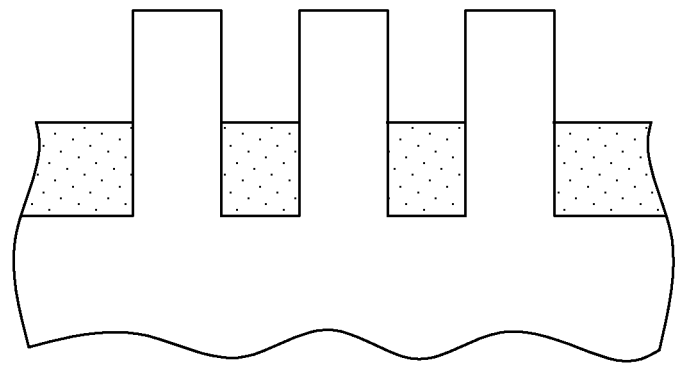
FIG. 26 one is example of the structure of FIG. 20 after removal of the U-shaped members, in accordance with one or more aspects of the present invention.

FIG. 26 is a cross-sectional view depicting another example fin structure, wherein no fin shaping is done, in accordance with one or more aspects of the present invention.

At this point, the flow continues with conventional replacement metal gate process (RMG) steps, for example, deposition of high-k and work-function, conductive electrode materials, etc.

The conventional flow, some of which is excluded in the figures for brevity, started with fin formation and STI, and continues with well formation, active fin reveal, dummy gate structure formation, n and p-type junction formation, replacement gate formation, silicide and contact formation, and BEOL interconnections. Part of the process of replacement gate formation is to remove the dummy gate material (e.g., polysilicon) and form a layer of dielectric, typically high-k, work-function layers, and conductive electrode layer.

The present invention flow precedes polysilicon removal and high-k formation with the following flow. The dummy gate material is exposed selectively (FIG. 17), e.g., via masking and etch. Next, any dummy gate material that is present is recessed (FIG. 18), as well as about 5 nm of the fin (FIG. 19). After the dummy gate material is removed, conformal dielectric layer 113 (see FIG. 16) is removed. At this point, the hard mask over the fins (i.e., U-shaped members 170) is removed, and the fin may then be shaped (FIGS. 21-25) or left as is (FIG. 26).

Note that if a first level fin (i.e., wider fin) is not desired, simply skip the appropriate steps. This would result in all fins being narrow. Note also that the wider fins can have a different threshold voltage (Vt) than the narrow ones, such that a two Vt scheme on FinFETs can be achieved.

In a first aspect, disclosed above is a method. The method includes providing a starting three-dimensional semiconductor structure, the structure including a semiconductor substrate and fin(s) coupled thereto, the fin(s) each including a channel region in a top center thereof, and removing portion(s) of the channel region(s).

In one example, the portion(s) of the channel region(s) removed exposes the substrate, creating a pair of fins for each with the portion(s) of the fin(s) removed, and the method may further include, for example, forming a layer of isolation material around a bottom portion of the fin(s) after removal of the center portion.

In one example, the method of the first aspect may further include, for example, forming a layer of isolation material around a bottom portion of the fin(s) prior to the removing.

In one example, the method of the first aspect may further include, for example, forming a layer of isolation material around a bottom portion of the fin(s) prior to the removing, the removing includes removing side portions of the fin(s) down to the isolation layer.

In one example, the removing in the method of the first aspect may include, for example, removing side portions of the fin(s), and the method may further include, for example, forming a layer of isolation material around a bottom portion of the fin(s) after the removing.

In a second aspect, disclosed above is a method. The method includes providing a starting semiconductor structure, the structure including a semiconductor substrate. The method further includes forming U-shaped member(s) of hard mask material over the substrate, the U-shaped member(s) being filled with filler material(s), removing portions of the substrate not covered by the U-shaped member(s), the removing forming fin(s), and forming a layer of isolation material about a bottom portion of the fins.

In one example, the method may further include, for example, removing vertical sections of the hard mask material on both sides of the filler layer, removing side portions of the fin body down to the layer of isolation material, and removing remaining portions of the filler layer.

In one example, the method of the second aspect may further include, for example, removing the filler material(s), leaving a U-shaped member of hard mask material atop each fin.

In one example, the method may further include, for example, extending an opening in each U-shaped member into a body of the fin(s), and removing any remaining hard mask material.

In one example, the method of the second aspect may further include, for example, forming dummy gate structure (s), the structure(s) including a dummy gate and spacers.

In one example, the method may further include, for example, forming epitaxial semiconductor material adjacent each spacer and isolation material over the epitaxial semiconductor material.

In one example, the method may further include, for example, replacing the dummy gate with conductive material and a gate cap.

In one example, the starting semiconductor structure in the method of the second aspect may further include, for example, a hard mask layer over the substrate, a layer of filler material(s) over the hard mask layer and a layer of amorphous carbon over the filler layer. Further, the forming in the method of the second aspect may include, for example, removing portions of the layer of amorphous carbon to create mandrels, forming a conformal layer of hard mask material over the structure and mandrels, removing horizontal portions of the conformal layer of hard mask material and the mandrels, leaving vertical sections of the conformal layer, removing the filler material everywhere except for vertical portions directly below each vertical section of the conformal layer, removing the vertical sections of the conformal layer, leaving vertical sections of the filler material, and forming a blanket conformal layer of hard mask material over the structure.

In one example, the method of the second aspect may further include, for example, removing exposed horizontal sections of the blanket conformal layer of hard mask material, and forming a layer of isolation material surrounding a lower portion of the fin(s).

In a third aspect, disclosed above is a semiconductor structure. The structure includes a semiconductor substrate, semiconductor fin(s) coupled to the substrate, the fin(s) including a source region, a drain region and a channel region therebetween, and isolation material surrounding a bottom portion of the fin(s), portion(s) of the channel region having been removed.

In one example, the portion(s) include a center portion, such that a cross-section of the channel region has a forked shape.

In another example, the portion(s) include side portions of the channel region, resulting in a narrower fin in the channel region.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a starting semiconductor structure, the structure comprising a semiconductor substrate;
forming at least one U-shaped member made only of hard mask material over the substrate, each U-shaped member being filled with at least one filler material;
removing portions of the substrate not covered by the at least one U-shaped member, the removing forming one or more fins;
forming a layer of isolation material about a bottom portion of the fins;
removing the at least one filler material, leaving a U-shaped member of hard mask material atop each fin;
extending an opening in each U-shaped member into a body of the at least one fin at only a channel region; and
removing any remaining hard mask material, resulting in the channel region having a forked cross-sectional shape.

2. The method of claim 1, further comprising;
removing vertical sections of the hard mask material on both sides of the filler layer;
removing side portions of the fin body down to the layer of isolation material; and
removing remaining portions of the filler layer.

3. The method of claim 1, further comprising forming at least one dummy gate structure, the structure comprising a dummy gate and spacers.

4. The method of claim 3, further comprising forming epitaxial semiconductor material adjacent each spacer and isolation material over the epitaxial semiconductor material.

5. The method of claim 4, further comprising replacing the dummy gate with conductive material and a gate cap.

6. The method of claim 1, wherein the starting semiconductor structure further comprises a hard mask layer over the substrate, a layer of at least one filler material over the hard mask layer and a layer of amorphous carbon over the filler layer, the forming comprising:
removing portions of the layer of amorphous carbon to create a plurality of mandrels;
forming a conformal layer of hard mask material over the structure and mandrels;
removing horizontal portions of the conformal layer of hard mask material and the mandrels, leaving vertical sections of the conformal layer;
removing the filler material everywhere except for vertical portions directly below each vertical section of the conformal layer;
removing the vertical sections of the conformal layer, leaving vertical sections of the filler material; and
forming a blanket conformal layer of hard mask material over the structure.

7. The method of claim 6, further comprising:
removing exposed horizontal sections of the blanket conformal layer of hard mask material; and
forming a layer of isolation material surrounding a lower portion of the fins.

* * * * *